(12) United States Patent
Zhou et al.

(10) Patent No.: US 7,595,490 B2
(45) Date of Patent: Sep. 29, 2009

(54) CHARGED PARTICLE BEAM EMITTING DEVICE AND METHOD FOR OPERATING A CHARGED PARTICLE BEAM EMITTING DEVICE

(75) Inventors: Fang Zhou, Pliening/Landsham (DE); Pavel Adamec, Haar (DE); Jürgen Frosien, Riemerling (DE); Jimmy Vishnipolsky, Petah Tikwa (IL)

(73) Assignee: ICT, Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 454 days.

(21) Appl. No.: 11/469,728

(22) Filed: Sep. 1, 2006

(65) Prior Publication Data

US 2007/0158588 A1 Jul. 12, 2007

(30) Foreign Application Priority Data

Sep. 5, 2005 (EP) .................................. 05019259

(51) Int. Cl.
*G01N 23/00* (2006.01)
*G21K 7/00* (2006.01)

(52) U.S. Cl. ...................... 250/310; 250/306; 250/307; 250/311; 250/423 R; 250/423 F; 250/431; 250/492.3; 250/492.2; 315/107; 315/106; 315/383; 315/360; 315/307; 328/90; 313/310; 313/341; 313/343; 313/336; 445/59

(58) Field of Classification Search ................ 250/310, 250/306, 307, 311, 432 R, 423 F, 431, 492.3, 250/492.2; 315/107, 106, 383, 360, 307; 328/90; 313/310, 341, 343, 336; 445/59
See application file for complete search history.

(56) References Cited

U.S. PATENT DOCUMENTS 3,786,268 A * 1/1974 Nomura ...................... 250/311

(Continued)

FOREIGN PATENT DOCUMENTS

JP 52046756 4/1977

(Continued)

OTHER PUBLICATIONS

W. K. Lo et al., "Titanium nitride coated tungsten cold field emission sources," J. Vac. Sci. Technol. B. Nov./Dec. 1996 vol. 14(6): pp. 3787-3791.

(Continued)

*Primary Examiner*—Jack I Berman
*Assistant Examiner*—Meenakshi S Sahu
(74) *Attorney, Agent, or Firm*—Patterson & Sheridan, LLP

(57) ABSTRACT

A method for operating a charged particle beam emitting device and, in particular, an electron beam emitting device including a cold field emitter is provided. The method includes the steps of placing the cold field emitter in a vacuum of a given pressure, the emitter exhibiting a high initial emission current $I_0$ and a lower stable mean emission current $I_S$ under a given electric extraction field; applying the given electric extraction field to the emitter for emitting electrons from the emitter surface; performing a cleaning process by applying at least one heating pulse to the cold field emitter for heating the emitter surface, whereby the cleaning process is performed before the emission current of the cold field emitter has declined to the lower stable mean emission value $I_S$; and repeating the cleaning process to keep the emission current of the emitter continuously above the substantially stable emission value $I_S$.

36 Claims, 6 Drawing Sheets

U.S. PATENT DOCUMENTS

| | | | |
|---|---|---|---|
| 3,825,839 | A | 7/1974 | Someya et al. |
| 3,887,839 | A | 6/1975 | Ota et al. |
| 4,090,106 | A | 5/1978 | Okumura et al. |
| 5,399,865 | A | 3/1995 | Umemura et al. |
| 2004/0124365 | A1 | 7/2004 | Steigerwald |

FOREIGN PATENT DOCUMENTS

| | | |
|---|---|---|
| JP | 55104059 A | 8/1980 |
| JP | 61051725 | 3/1986 |
| JP | 2002208368 A | 7/2002 |

OTHER PUBLICATIONS

Japanese Office Action dated Sep. 1, 2008.
Lo, et al. "Titanium Nitride Coated Tungsten Cold Field Emission Sources", J. Vac. Sci. Technol. B, vol. 14 No. 6, 1996. pp. 3787-3791.
International Search Report. Sep. 29, 2008.
Japanese Office Action dated Mar. 30, 2009.

\* cited by examiner

CHARGED PARTICLE BEAM EMITTING DEVICE AND METHOD FOR OPERATING A CHARGED PARTICLE BEAM EMITTING DEVICE

CROSS-REFERENCE TO RELATED APPLICATION

This application claims priority to European Patent Application No. 05019259.0, filed Sep. 5, 2005, which is herein incorporated by reference.

FIELD OF THE INVENTION

Embodiments of the invention relate to improvements in the field of charged particle beam emitting apparatus and, more particularly, to a method for operating an electron beam emitting apparatus including a cold field emitter.

BACKGROUND OF THE INVENTION

Charged particle beam emitters, such as cold field emission emitters, have an enormous potential due to their high brightness, small source size, and low energy spread. A cold field emitter typically includes a crystal of tungsten formed to a very narrow point, which is mounted to a loop of tungsten wire. The very narrow point is also frequently referred to as an emitter tip. When applying a voltage to the cold field emitter, a very strong electric field is formed at the emitter tip due to the tip's small curvature. The strong electric field enables the electrons to pass the potential barrier between the metal and the vacuum in which the cold field emitter is placed. Accordingly, the established electric field is often referred to as an electric extractor field as it causes the electrons to be "extracted" from the emitter tip. As compared to so-called thermal emitters, which are heated to a temperature sufficient to enable thermal emission, cold field emitters are not heated so that electrons are only emitted due to the presence of the strong electric field. As the electric field strength of the electric extractor field is only sufficiently strong in the vicinity of the highly curved emitter tip, electrons are only emitted therefrom resulting in a point-like electron source.

Despite its superior advantages with respect to brightness, source size, and low energy spread, cold field emitters are also known as being unstable and delicate due to adsorption and desorption of residual gas molecules of the vacuum which drastically alters the emission characteristic of the cold field emitter. In order to obtain a reasonably stable emission, an ultra high vacuum is required which is typically better than $1.33 \cdot 10^{-7}$ Pa ($10^{-9}$ Torr) and in certain cases better than $1.33 \cdot 10^{-9}$ Pa ($10^{-11}$ Torr). Principally, the lower the pressure the better the vacuum and hence the stability.

A typical emission characteristic of a clean cold field emitter under a constant extraction field exhibits an initial high emission current $I_0$. Upon further operation under standard conditions (i.e., under a constant electric extraction field, a given vacuum, and a constant low temperature) the emission current declines continuously due to increasing adsorption of residual gas molecules in the vacuum on the surface of the emitter tip. At the same time, gas molecules adhering to the emitter surface begin to desorb from the emitter surface so that after a certain period of time, adsorption and desorption of gas molecules are balanced. When the balance condition is reached, or in other words, when a dynamical equilibrium of adsorption and desorption has been established, the emission current is substantially stable and assumes a stable mean emission current $I_S$. Under this balanced condition the emission current fluctuates around the substantially stable mean emission current $I_S$, which is well below the initial high emission current $I_0$. An exemplary emission current of a cold field emitter is, for instance, shown in FIG. 1 of Okumura et al. (U.S. Pat. No. 4,090,106) which is reproduced in FIG. 4 of the present application. As indicated in FIG. 4, the emission current I declines from $I_0$ to a stable mean emission current $I_1 (=I_S)$. This period is sometimes referred to as the initial unstable period. The time required for the stabilization of the emission current and the extent of the emission current decline depend on the quality of the vacuum. The balanced condition is established after a few minutes depending on the quality of the vacuum. Conventionally, the period of stable emission is sometimes referred to as the stable emission period.

In order to obtain a constant emission current Okumura et al. suggest controlling the field strength of the extraction field so that the emission current is kept about $I_S$ even during the initial unstable region. Specifically, at the beginning of the field emission when the emitter tip is still clean, a lower electric extraction field is applied to keep the emission current at $I_S$. Upon further operation, the field strength of the electric extraction field is ramped up to compensate the decline of the emission current which would otherwise occur under constant electric field conditions.

The balanced conditions may be affected by positively charged ions or molecules, which are accelerated by the electric extraction field towards the surface of the emitter tip resulting in fluctuations of the emission current. Molecules or ions impinging on the surface of the emitter tip lead to a partial desorption of adsorbed gas molecules and hence, to a temporal removal of residual gas molecules from the emitter tip resulting in a temporal rise of the emission current. As this effect is counterbalanced by a continuous adsorption of gas molecules, fluctuation of the emission current is observed. The fluctuations become stronger over long periods of operation and, using the notation of Okumura et al., a terminal unstable region is reached when strong fluctuations are observable. In the worst case, the fluctuations may result in an avalanche of desorption and a subsequent uncontrolled emission. The emitter tip may be destroyed if the field strength of the electric extraction field cannot be reduced fast enough.

To reduce fluctuations and to increase the emission current, different approaches have been suggested. For example, the emitter tip can be coated with a material having a low work function to reduce the voltage required for extracting electrons. Alternatively, the emitter tip, such as a ZrO/W [100] Schottky emitter, can be heated to about 1800 K to 2000 K to thermally stimulate electron emission. However, such emitters are not "cold" emitters. Contrary to cold emitters, hot or thermal emitters emit from the whole emitter surface rather than only from the emitter tip and therefore, do not have a point-like source like cold emitters. A further option for reducing fluctuations is to improve the vacuum. However, this approach is very expensive and increases the cost-of-ownership.

It has also been proposed to decontaminate the emitter tip after a given long period of operation. Typically, the emitter tip is cleaned by short healing pulses, also referred to as flashing, during which the emitter tip is heated to a temperature sufficiently high to cause a noticeable desorption of adsorbed gas molecules. As disclosed by Okumura et al. and referred to above, the emitter tip is decontaminated by flashing using an electrical heater when the fluctuations about the mean stable emission current $I_S$ become more pronounced. The decontamination intervals are then typically in the range of hours. It is also known to heat the emitter tip of a cathoderay type electron gun at fixed time intervals as, for instance, described by Iwasaki (U.S. Pat. No. 5,491,375) to keep the emission stable at the mean emission current $I_S$. Furthermore, Steigerwald (U.S. Patent No. 2004/0124365) suggests using a photon beam focused on the emitter tip to heat the emitter tip to a temperature of about 1300 K to 1500 K for a partial decontamination.

SUMMARY OF THE INVENTION

One embodiment of the present invention is a method for operating a charged particle beam emitting device comprising a charged particle beam source having an emitter surface. The method generally includes the steps of placing the charged particle beam source in a vacuum of a given pressure, the charged particle beam source exhibiting a high initial emission current $I_0$ and a lower stable mean emission current $I_S$ under given operational conditions; applying the given operational conditions to the charged particle beam source for emitting charged particles from the emitter surface, so that the emission current of the charged particle beam source is higher than the stable mean emission current $I_S$; performing a cleaning process by applying at least one heating pulse to the charged particle beam source for heating the emitter surface to a temperature $T_C$, whereby the cleaning process is performed before the emission current of the charged particle beam source has declined to the lower stable mean emission value $I_S$; and repeating the cleaning process to keep the emission current of the charged particle beam source continuously above the substantially stable emission value $I_S$.

Another embodiment of the present invention is a method for operating an electron beam emitting device comprising a cold field emitter having an emitter surface. The method generally includes the steps of placing the cold field emitter in a vacuum of a given pressure, the cold field emitter exhibiting a high initial emission current $I_0$ and a lower stable mean emission current $I_S$ under a given electric extraction field; applying the given electric extraction field to the cold field emitter for emitting electrons from the emitter surface, so that the emission current of the cold field emitter is higher than the stable mean emission current $I_S$; adjusting the strength of the electric extraction field to keep the emission current substantially stable and continuously above the mean stable emission current $I_S$ at a predefined value $I_C$ being higher than $I_S$; performing a cleaning process by applying at least one heating pulse to the cold field emitter for heating the emitter surface to a temperature $T_C$, whereby the cleaning process is performed when the strength of the electric extraction field exceeds a predefined reference value; and repeating the adjusting step and the cleaning process to keep the emission current of the cold field emitter continuously above the substantially stable emission value $I_S$.

Yet another embodiment of the present invention is a method for operating a charged particle beam emitting device comprising a charged particle beam source having an emitter surface. The method generally includes the steps of generating a charged particle beam, focusing the generated charged particle beam onto a sample or specimen, and automatically performing a cleaning process for cleaning the emitter surface upon occurrence of a triggering event.

Yet another embodiment of the present invention provides for a charged particle beam emitting device. The emitting device generally includes a charged particle beam source for emitting charged particles, the charged particle beam source comprising an emitter surface; a voltage unit configured to apply a voltage to the charged particle beam source for generating a charged particle beam; a heating element configured to heat the emitter surface; and a control unit comprising an input configured to receive a trigger signal, the control unit being operative to control the heating element to apply at least one heating pulse to the emitter surface of the charged particle beam source during the generation of the charged particle beam upon reception of a trigger signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE DRAWINGS

Figure 1:
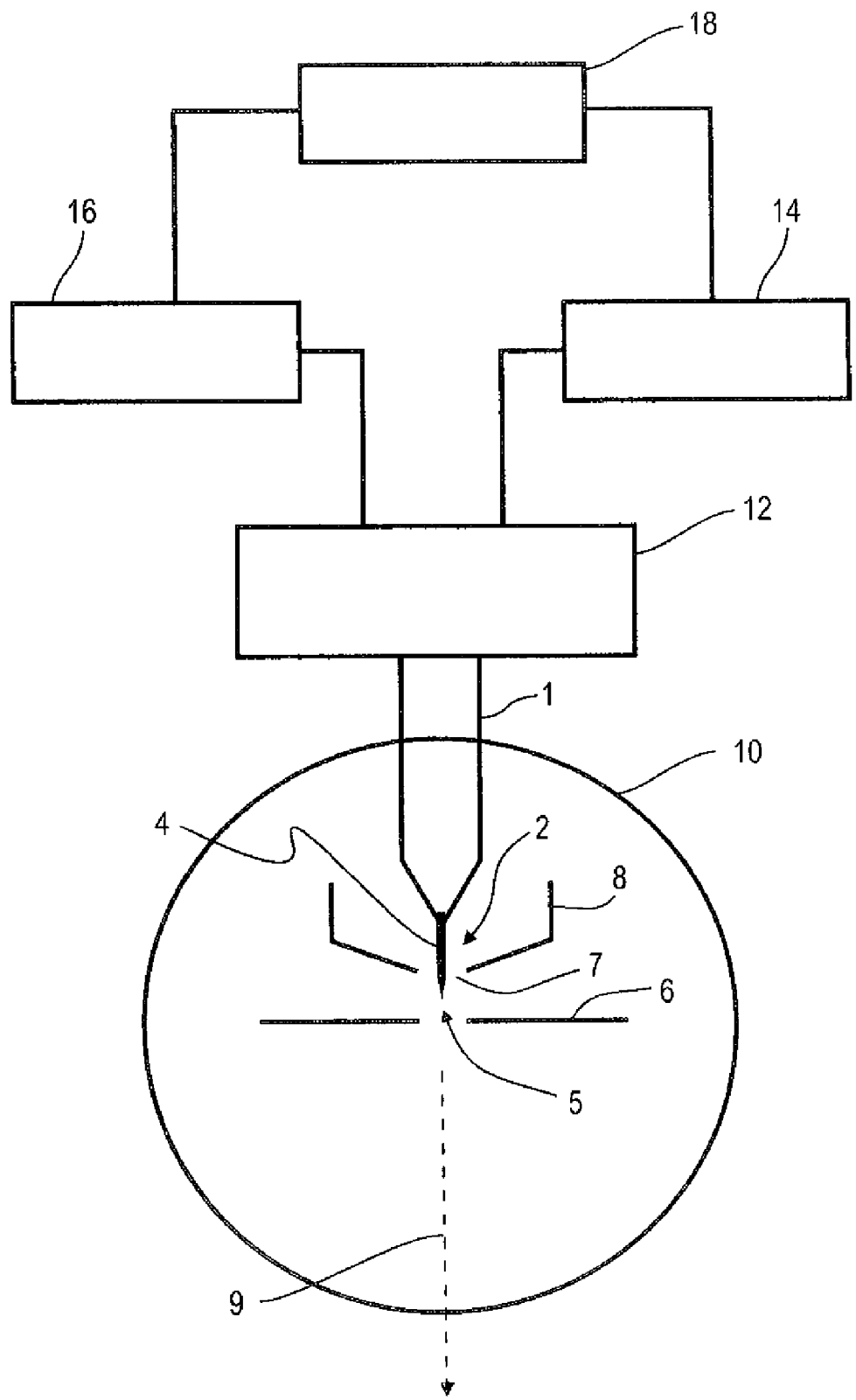
FIG. 1 shows a typical arrangement of an electron beam emitting device according to prior art.

Reference will now be made in detail to various embodiments, examples of which are illustrated in the drawings. In the figures and the description that follows, like reference numerals refer to similar elements. The example is provided by way of explanation, and is not meant as a limitation of the invention. For example, features illustrated or described as part of one embodiment can be used on or in conjunction with other embodiments to yield yet a further embodiment. It is intended that the present invention include such modifications and variations.

Figure 4:
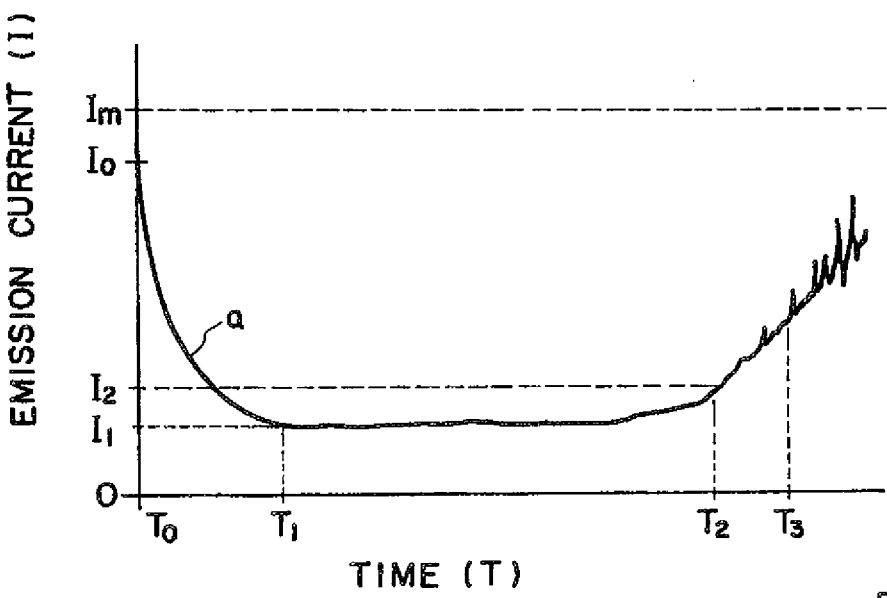
FIG. 4 shows a typical prior art emission characteristic of a cold field emitter.

In order to keep the emission current of a cold field emitter at a very high level, the cold field emitter and, in particular, its emitter surface may be frequently, and for some embodiments periodically, cleaned to remove contaminations adhered to the emitter surface. For a better understanding of the present invention, reference is made to FIG. 4 which illustrates a typical emission characteristic of a cold field emitter. FIG. 4 is a reproduction of FIG. 1 of Okumura et al. (U.S. Pat. No. 4,090,106). Generally, an emitter surface of a cold field emitter is placed in a suitable vacuum which should have a pressure at least less than $1.33 \times 10^{-7}$ Pa ($10^{-9}$ Torr) and, in particular, less than $1.33 \times 10^{-9}$ Pa ($10^{-11}$ Torr). For a moment, the emitter surface of the cold field emitter may assumed to be clean (i.e., it is free from any debris or contaminations). Those skilled in the art are aware that a completely clean emitter surface is practically not available as there are always impurities in the material of the emitter tip itself, impurities emitted from heating filaments and/or residual gas molecules in the vacuum which partially contaminate the emitter surface. Hence, when referring to a clean emitter surface, it is meant that the emitter surface is substantially free from debris and contaminations.

A cold field emitter having a clean emitter surface emits a very high emission current. The level of the emission current strongly depends on the field strength of the applied electric extraction field. To observe field emission, the field strength should be in the range of about 10 MVcm$^{-1}$ and above. At such high field strengths, the width of a potential barrier, which exists between the material of the emitter surface and the vacuum, becomes smaller so that the electrons can traverse this barrier by a wave mechanical tunneling effect. In order to generate such a strong electric field in the vicinity of the emission surface, a point-like emitter tip is used having a radius of curvature of about 0.1 μm or less. As the electric field strength is inversely proportional to the radius of the curvature, only the highly curved surface at the tip forms an effective emitter surface. In the vicinity of less curved portions of the emitter the established electric field is too weak to appreciably extract electrons so that electrons are merely extracted from the tip of cold field emitters, which thus forms a point-like electron source.

Still referring to FIG. 4, the initial emission current of a clean emitter surface under a given electric extraction field in a given vacuum at time $t_0$ is represented by $I_0$ indicated at the abscissa. Under further standard operation (i.e., under a constant electric extraction field, constant vacuum condition, and at a constant low temperature), the emission current noticeably declines with time due to an increase of gas adsorption on the emitter surface. As the adsorption is increasingly counterbalanced by gas desorption, a dynamical equilibrium of adsorption and desorption comes into being after a certain time which leads to a temporarily stable contamination of the emitter surface. When the dynamical equilibrium or the balanced region is formed, the emission current of the cold field emitter substantially remains constant apart from fluctuations around a stable mean emission current. In FIG. 4, the balanced region is reached at time $t_1$ at which the emission current has declined to a value $I_1$ which is substantially lower than the initial emission current $I_0$. A concrete example of an emission characteristic of a cold field emitter is, for instance, disclosed in W. K. Lo et al., "Titanium nitride coated tungsten cold field emission sources," J. Vac. Sci. Technol. B 14(6), Nov/Dec 1996, 3787-3791. FIG. 3(A) of this scientific article shows that the emission current drops from about 800 μA to about 500 μA within 300 sec. The emission remains substantially stable for at least an hour. Returning to FIG. 4 of the present application, the initial phase between $t_0$ and $t_1$ in which the emission current declines, is often referred to as initial unstable region, and the phase following the initial unstable region (i.e., the region after time $t_1$), is referred to as the stable region.

Typically, electron beam emitting devices have been operated in the stable region (i.e., after establishing the balanced condition) to obtain a substantially stable emission over a long period of time. As it becomes clear from FIG. 3(A) of W. K. Lo et al., the emission current I in that stable region is substantially lower than the initial emission current of a clean emitter surface.

In view of the above, the present invention has been developed in an effort to increase significantly the emission current and to keep it at a high level over a very long period. In accordance with an important concept of the invention, the cold field emitter may be operated continuously in the initial unstable region. For this purpose, an initially clean emitter surface may be frequently subjected to a cleaning process which removes contaminations from the emitter surface in an effort to keep the emission current near the maximum obtainable emission current. The cleaning process may be initiated after a lapse of time $t_C$, whereby $t_C$ is between $t_0$ and $t_1$ (in FIG. 4), or, in other words, before the emission current has fallen to the mean stable emission value $I_S$ ($I_1$ in FIG. 4). After finishing the cleaning process, the emission current should rise and, more particularly, may reassume its initial high emission current $I_0$. The cleaning process may be repeated after a further period of time $t_C$ has lapsed or when the emission current has fallen to $I_C$, which is a pre-selected reference value between $I_S$ ($=I_1$) and $I_0$. As a result, the emission current may vary between $I_C$ and $I_0$ due to the frequent cleaning.

If the initiation of the cleaning process is governed by the drop of the emission current, the emission current may need to be measured by appropriate devices to control the cleaning process. Alternatively or in combination with the above emission current control, the cleaning process may be repeated after pre-defined time intervals, which may be chosen such that the emission is continuously kept above the stable mean emission current $I_S$. Control measurements may be performed in advance for particular types of cold field emitters to obtain the specific emission characteristic of each type which than serves as a basis for selecting the respective cleaning intervals.

$I_C$, the value at which a cleaning process is initiated, may be defined as $I_C = \alpha I_0$, whereby $\alpha$ can be in the range of about 0.8 to 0.99 and particularly in the range between 0.9 and 0.99. The higher the value of $\alpha$ that is chosen, the higher the mean emission current at which the cold field emitter is operated may be. On the other hand, a very high $\alpha$ may also require a very frequent repetition of the cleaning process leading to a more frequent switching between active and inactive periods. Hence, the value $\alpha$ should be selected so as to maintain a very high emission current while keeping the interruption low.

It is worth noting that the cleaning process may be repeated more frequently than required with the duration of each single cleaning process being shortened at the same time. In this case, a single cleaning process may include only a single heating pulse (flashing). A single cleaning process might not be enough to completely clean the emitter surface and to bring the emission current back to $I_0$, but may be sufficient to bring the emitter surface into the same clean condition as it was after the preceding cleaning process. Because the cleaning process is repeated very frequently in this case, the emitter surface may be thus kept in a sufficiently clean condition. On the other hand, the level of contamination may not vary very much due to the very frequent and short cleaning processes, and hence, the emission current may remain substantially stable. The short term stability of the emission current should therefore be improved. As an example, the emission current may oscillate or vary between an upper value of about 0.95 $I_0$ and a lower value of about 0.93 $I_0$. In other words, the emission current may be kept in an emission current band defined by a maximum value $I_{max}$ and a minimum value $I_{min}$. The difference between $I_{max}$ and $I_{min}$ is defined as $\Delta I = I_{max} - I_{min} = \gamma I_{max}$. The width of the emission current band is given by $\Delta I = \gamma I_{max}$. For example, when $\gamma$ is about 0.1, the emission current band has a width which is about 10% of $I_{max}$, whereas $\gamma = 0.05$ would give a width of about 5% of $I_{max}$ and $\gamma = 0.02$ would give a width of about 0.02% of $I_{max}$. The emission current may therefore be kept by the frequent cleaning in the emission current band defined by $I_{max}$ and $\gamma$.

It should be noted that the cleaning process may specifically be performed when the cold field emitter is working. It should be ensured that the interruption of the normal mode (i.e., the mode at which the emitted electron beam illuminates a specimen) is kept as short as possible. A single cleaning process should be substantially less than 5 minutes. Preferably, a single cleaning process may be less than about 60 seconds or substantially less than that, for example less than 20 or 10 seconds. The duration of a single cleaning process may be adjusted depending on the level of contamination. Alternatively, the emission current may be controlled during cleaning so that the cleaning process stops when the emission current has assumed its initial emission value or has reached a value close to it.

Typically, the cleaning processes may be performed at intervals of more than about 60 sec and for some embodiments, of more than about 240 see or 300 sec. Cleaning of the emitter surface every 4 to 10 minutes (intervals between about 240 sec and about 600 sec) has proved to be sufficient for many applications. The period between consecutive cleaning processes may be mainly determined by the quality of the vacuum. By increasing the quality of the vacuum, cleaning processes should be less frequently required. As the maintenance of a very or ultra high vacuum is very expensive, a segmentation of the particle beam emitting device into separate compartments having different levels of vacuum may be advantageous. For instance, the particle or electron beam emitting device may comprise three chambers. In a first chamber, in which an ultra high vacuum is maintained, the particle beam source may be arranged. A second or intermediated chamber may be arranged in the direction of the optical axis of the particle beam emitting device. Further down along the optical axis, a third or specimen chamber may be arranged. First and second chamber and second and third chamber, respectively, may be separated from each other by differential pressure apertures. The pressure in the third chamber may be higher than in the second chamber, which in turn may have a higher pressure than the first chamber. With this design, therefore, the best vacuum should be in the first chamber. The different levels of vacuum may be maintained by separate vacuum pumps. The segmentation of the particle beam emitting device should allow the vacuum in the first chamber, in which the particle beam source is arranged, to be kept at very high level and should prevent intrusion of contaminations from the other two chambers, particularly from the third chamber where contaminations may be generated due to the interaction of the electron beam with the specimen surface. Consequently, the first chamber may be less likely to be contaminated, and a cleaning may be less frequently required. Further aspects and details of separated chambers of a particle beam emitting device can be inferred from Patent Cooperation Treaty Application No. WO 2005/027175 of the same applicant, the disclosure of which is herewith completely incorporated by reference.

When the electron beam emitting device is an electron microscope used for process diagnostics or wafer inspection during manufacturing of integrated circuits formed on semiconductor wafers, the cleaning process may be applied in combination with imaging or specimen activities. For example, the cleaning process may be carried out only in the interval of an extended frame blanking. For instance, for CD/DR (critical dimension/defect review) wafer inspection, the cleaning process may be done in the swap time between wafer exchanges, which is about 10 sec. Other examples of electron beam emitting devices are transmission electron microscopes (TEM) and scanning transmission electron microscopes (STEM), which may strongly benefit from the improved brightness and reduced noise gained by the frequent cleaning of their emitters.

Figure 3:
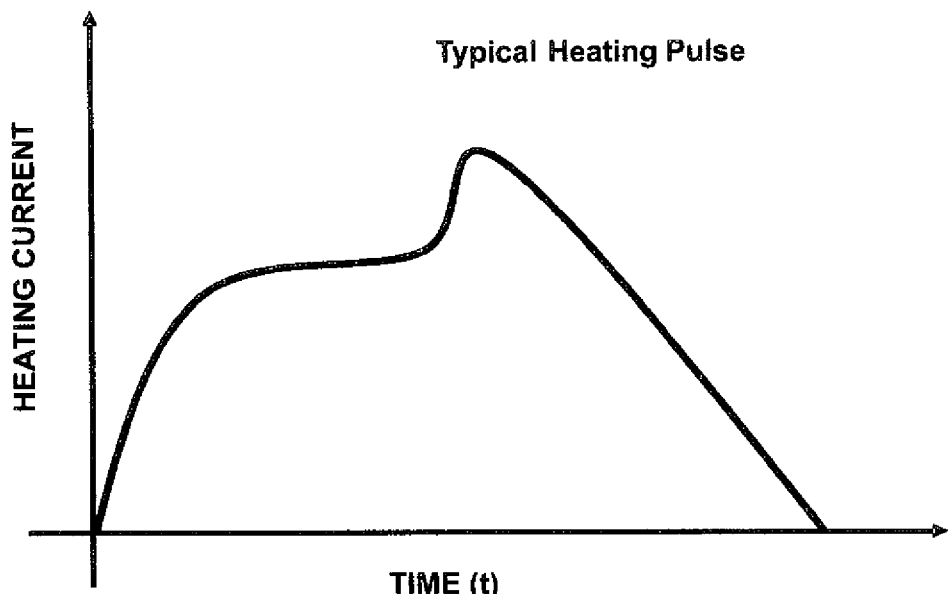
FIG. 3 shows a profile of a heating pulse in accordance with one embodiment of the invention.

A single cleaning process may include one, two, or more heating pulses to heat the emitter surface to a sufficiently high temperature $T_C$ to induce decontamination. According to one embodiment, $T_C$ is in the range of about 2200 K to 2500 K. This temperature range is particularly suitable for cold field emitters comprising tungsten. $T_C$ can vary depending on the material used for the emitter. Those skilled in the art can, on the basis of the described method, easily identify suitable temperature ranges for other materials. The pulse width should be short, such as about 1 to 2 sec. An example of a heating pulse is illustrated in FIG. 3. The heating pulse shown in FIG. 3 may be created by applying a controlled electrical current impulse to the cold field emitter so that the cold field emitter including its emitter surface is heated by resistance heating. The current required to heat the emitter surface to a given temperature may depend inter alia on the resistance of tungsten wire carrying the cold field emitter. Typically, a single cleaning process may include 2 to 4 heating pulses, each of which has a duration of about 1 to 2 sec. The heating pulses may be applied at intervals of 1 to 3 sec. However, those skilled in the art will appreciate that other numbers of heating pulses, durations, and intervals are also possible and can be adjusted according to specific needs.

The temperature at which the emitter surface is cleaned should be chosen such that no thickening of the tip radius is induced. At high temperature, the mobility of surface atoms of the cold field emitter's material (e.g., tungsten) may be increased. However, the material may not be melted and the heating temperature may be well below the melting temperature of the used material. As the emitter tip is strongly curved, the emitter surface may exhibit a high surface tension with a tendency to flatten or to dull the surface. The high surface tension may therefore lead to a re-shaping of the emitter tip. When the cleaning temperature is not too high, the atoms of the cold field emitter's material may not be mobile enough to induce reshaping of the emitter tip.

During heating of the cold field emitter, thermal emission may be induced. As thermal emission may not only occur on the emitter tip (i.e., on the strongly curved emitter surface at the tip), but also on other parts of the cold field emitter surface, a high electron shower may be generated, which may exceed the emission current resulting from field emission. As this temporarily additional thermal emission current can severely damage the emitter tip and/or delicate parts of the electron beam emitting device or a sample arranged in the electron beam emitting device, appropriate measures may be required in an effort to reduce thermal emission during cleaning. One option is the usage of a so-called suppressor electrode. A suppressor electrode is a specially shaped electrode which is arranged around the cold field emitter. An exemplary arrangement of a suppressor electrode is shown in FIG. 1, which is described in detail further below. Typically, the suppressor electrode has a central opening through which the emitter tip projects. A suppressor voltage may be applied to the suppressor electrode so that it has a lower electrical potential with respect to the cold field emitter. The suppressor voltage may thus have a repulsive effect and suppress thermal emission. The suppressor voltage should be chosen to substantially suppress any unwanted emission during the cleaning processes. As an example, a suppressor voltage of about 300 V to 1000 V and, preferably, of about 700 V to 1000 V may be applied.

In addition or alternatively to the use of a suppressor electrode, a beam blanker may be applied during the cleaning process. A beam blanker is an electron beam deflection device which deflects an electron beam by applying an electrostatic or magnetostatic field. The beam blanker may be incorporated into the electron beam emitting device between the electron source (i.e., the cold field emitter), and the specimen or sample to be investigated. During cleaning, the beam blanker may deflect the electron beam emitted from the cold field emitter so that the electrons do not strike the specimen. As the emission current may rise more than 10 times during cleaning, deflection of this high emission current may protect the specimen from being damaged.

In order to obtain good cleaning results and to reduce the number of the required cleaning procedures (i.e., to keep the frequency of the cleaning procedures short or, in other words, to keep the intervals between consecutive cleaning processes long), the vacuum should be of high quality. In particular, a vacuum of $6.65*10^{-9}$ Pa ($5*10^{-11}$ Torr) and, more particularly, of $1.33*10^{-9}$ Pa ($10^{-11}$ Torr) or better may ensure that the overall level of contamination is comparably small leading to overall improved emission performance and less demand for frequent cleaning processes.

In another embodiment of the invention, build-up processes may be performed at regular intervals or upon request. A build-up process is a method to sharpen the tip of a cold field emitter. For that purpose, the cold field emitter temperature should be raised to a temperature sufficiently high enough to ensure surface mobility of the material of the cold field emitter. A strong electrostatic field may be applied to the emitter surface in an effort to cause migration of surface atoms toward the emitter apex. As the surface migration is encountered by the surface tension of the highly curved emitter tip, the field strength of the applied electrostatic field should be high enough so that the electrostatic force acting on the surface atoms is higher than the force generated by the surface tension, Periodic build-up processes should maintain the shape of the highly curved emitter surface and compensate for a slowly-progressing dulling of the emitter surface caused by the surface tension and a removal of material during normal operation. A build-up process may be repeated periodically as a precautionary measure or when degradation of the emission current, which is not caused by contamination, is observable.

The re-shaping process may be mainly governed by two effects opposing each other. One effect may be the tendency of the emitter tip to become elongated under the influence of the electrostatic field, and the other effect may be the influence of the surface tension that results in a dulling of the emitter tip. The degree to which the emitter tip is re-shaped may therefore be controlled by selecting a certain temperature and field strength of the electrostatic field. If desired, the emitter tip may be re-shaped to assume a pre-selected shape. As the shape (i.e., the radius of the curvature) determines the emission current, the build-up process may be monitored by measuring the emission current. Unlike build-up processes described by Swanson (U.S. Pat. No. 3,817,592) and Frazer, Jr. et al. (U.S. Pat. No. 3,947,716), respectively, the build-up process described above should not require any additional gas to be introduced into the vacuum chamber. Further, as uncoated cold field emitters are typically used, the above build-up process may be applied since no additional coating process is desired as described by Fraser, Jr. et al., for instance.

In accordance with some embodiments, the temperature range of the build-up process should be in the range of about 2000 K to 3000 K depending on the material and strength of the applied electric field at the emitter tip. Particularly, pulsed heating may be applied. No further gases (e.g., $O_2$) may need to be introduced into the vacuum, and hence, the partial pressure of any gas components should remain constant during the build-up process.

Referring now to FIG. 1, an example of an electron beam emission device is illustrated on the basis of a scanning electron microscope (SEM) used for wafer inspection or process diagnostic (CR & DR) in the semiconductor industry. FIG. 1 merely shows a so-called electron gun, a device which includes a cold field emitter. However, those skilled in the art appreciate that a SEM includes more components such as electrostatic and magnetostatic lenses, deflectors, beam shapers, etc., defining the so-called column of the SEM.

In semiconductor industry application, high brightness and high resolution particle beam inspection, review and CD tools may be required. In particular, high resolution SEMs may be used which strongly benefit from the cleaning method described above. SEMs may enable visual inspection of lithographic masks and wafers which allows a fast and easy evaluation of the manufacturing quality. The wafers or masks may be transferred from a process chamber into the SEM and, after completion of the inspection, may be brought into another chamber. In order to restrict interruption of the inspection and manufacturing process, the exchange time periods required to transfer the wafers or masks into or from the SEM may be particularly used for carrying out cleaning processes. Accordingly, the active or operational period (i.e., the time available for inspection) of the SEM may not be affected. Furthermore, other inactive or non-operational periods of the SEM tool, such as stage movements from one location to another or system calibrations may also provide time frames during which the cleaning processes can be initiated. Utilizing computer controlled systems, all actions to be taken may be supervised to synchronize emission surface cleaning and system operation.

An electron emission gun of a SEM may include a tungsten wire 1 bent to a U-form. At the bent portion of the tungsten wire 1, a tungsten crystal 4 formed to a very narrow point or tip (emitter surface) 5 may be welded. Typically, uncoated polycrystalline tungsten or uncoated mono-crystalline tungsten with a [100] or a [310] orientation is used. The tungsten crystal may form a cold field emitter 2. The sharp tip 5 may point downwards in FIG. 1 along an optical axis 9 of the SEM. A cup-shaped suppressor electrode 8 may surround the cold field emitter and, in particular, the tungsten crystal 4. At its center, the suppressor electrode 8 may include an opening 7 through which the tungsten crystal 4 may partially extend so that the tip 5 downwardly projects the suppressor electrode 8. An extraction anode 6 may be disposed along the optical axis 9 in spaced relation to the suppressor electrode 8 and the emitter tip 5. The extraction anode 6 may include a central opening aligned with the optical axis 9 of the SEM. During normal operation, an extractor voltage may be applied between the extraction anode 6 and the cold field emitter 2 so that the extractor anode 6 has a positive potential with respect to the cold field emitter 2. Due to the sharp tip 5, the electric field should be highly curved at tip 5 giving rise to high extraction field strength in the vicinity of the tip. On the other hand, the suppressor electrode 8 may have a negative potential with respect to the cold field emitter 2 to shield portions of the cold field emitter and the tungsten wire other than the tip from the electric extraction field. The electric suppressor field generated by the applied suppressor voltage may substantially weaken the extraction field so that only the tip is exposed to the extraction field. During cleaning, the electric suppressor field may suppress unwanted thermal emission from the cold field emitter.

The cold field emitter 2 may be disposed in a high vacuum chamber 10 along with other parts of the SEM. The vacuum should be in the range better than $6.65*10^{-9}$ Pa ($5*10^{-11}$ Torr). The better the vacuum (i.e., the lower the pressure) is, the slower the emitter surface may become contaminated. As noted above, the vacuum chamber 10 may be formed by a plurality of vacuum sub-chambers separated from each other by appropriate differential pressure apertures.

The tungsten wire 1 may be connected to a heating current source 12, which may be controlled by a heating current controller 16. The heating current controller 16 may define the length, amplitude, and width of the heating pulse. An overall system control computer 18 connected with the heating current controller 16 may trigger the cleaning process and synchronize it with the inspection cycle. The overall system control computer 18 may also control the suppressor and extraction voltages and an HV-source 14 connected with the heating current source.

Figure 2:
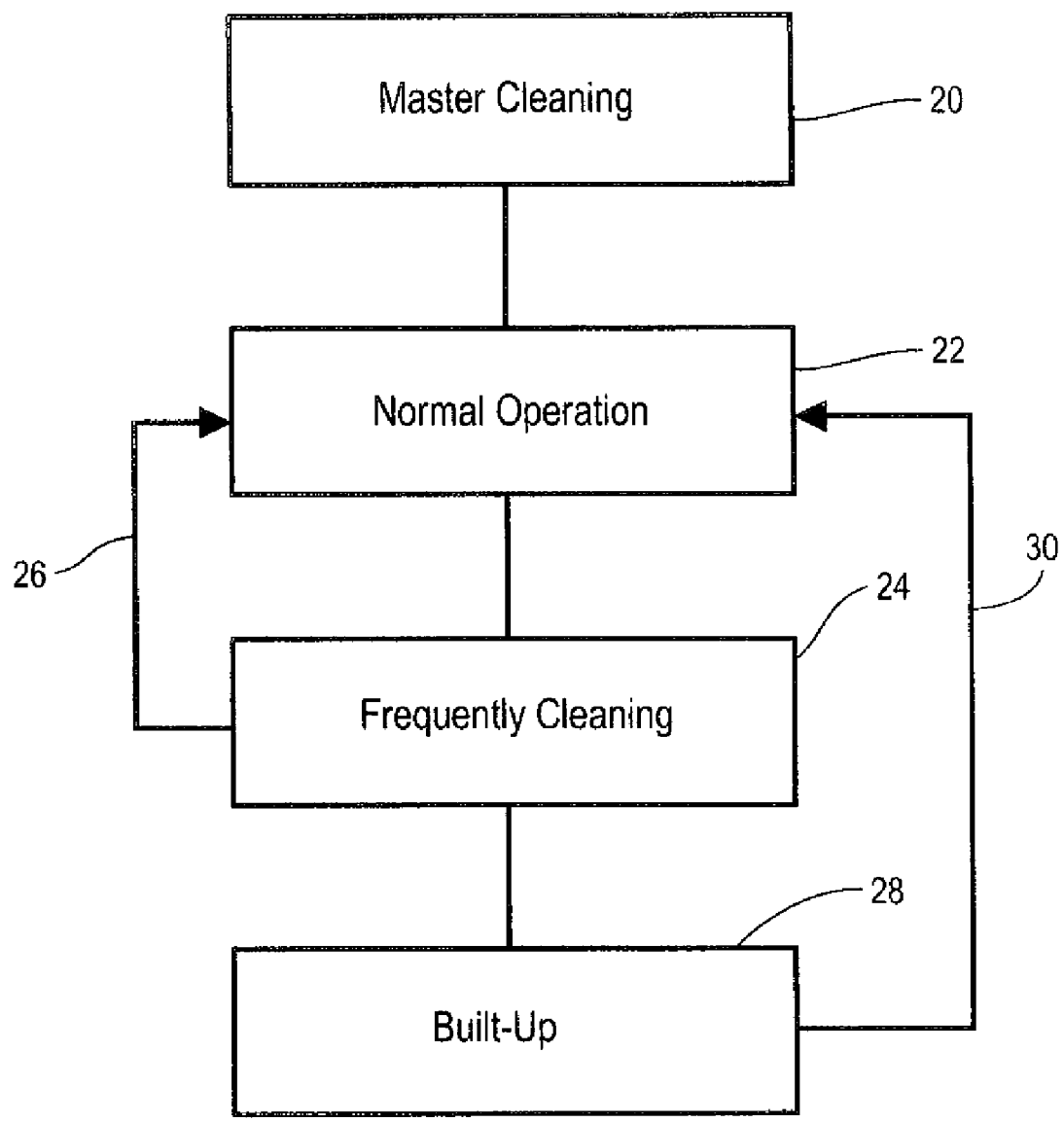
FIG. 2 shows main steps of the method in accordance with one embodiment of the invention.

Referring to FIG. 2, a process of sequences in according to one embodiment is described.

At the beginning of the operation and, particularly, when a new cold field emitter has been assembled into the electron beam emitting device, a master cleaning process (20) may be carried out to clean the emitter surface from any persistent contamination. The master cleaning process may typically employ short and strong heating pulses (master flashing), which heat the emitter surface to a temperature $T_{MC}$ of about 2500 K to 2800 K. During master cleaning, the extractor voltage applied between cold field emitter and extraction anode should be turned off so that emission of thermal electrons is kept low.

After master cleaning (20), the cold field emitter may be brought into normal operation (22) by applying an electric extraction field. Cold field emitters may be operated at room temperature without any additional heating so that the electron emission is only field induced. During normal operation, an electron beam may be generated and directed onto a specimen to be investigated.

Normal operation (22) or the active period of the SEM may then be briefly interrupted to perform a cleaning process (24). Interruption of the normal mode may mean that the electron beam is not focused onto the specimen. It may therefore be possible to maintain the operating conditions of the normal mode and, for example, to deflect the electron beam using a beam blanker. Hence, the cleaning process may be generally initiated when the cold field emitter is working unlike the prior art which performs a cleaning step when the fluctuations of the emission current become intolerable and the operation of the electron beam emitting device is therefore terminated.

Heating pulses may be applied during the cleaning process (24) to the cold field emitter in an effort to heat the emitter surface to a maximum temperature of about 2200 K to 2500 K. The maximum temperature should be lower than the temperature at which dulling or thickening of the emitter tip due to high surface tension is observed. As an example, a single cleaning process may include 2 to 4 heating pulses having a pulse width of about 1 to 2 sec at 1 to 3 sec intervals. The duration of a single cleaning process should be as short as possible to keep the interruption of the normal mode as small as possible. For instance, a cleaning process should be shorter than 1 minute and particularly less then 10 sec.

To avoid damage of the emitter surface during cleaning, a high suppressor voltage of about 300 V to 1000 V and, preferably, of about 700 V to 1000 V may be applied which should inhibit unwanted emission from heated portions of the cold field emitter.

The cleaning process (24) may be repeated (26) as often as required to keep the emitter surface clean. The cleaning process may be initiated at regular intervals or upon request when the emission current drops to a pre-selected minimum value $I_C$ defined as $\alpha I_0$ with $\alpha$ about 0.9 or higher such as 0.95, 0.96, 0.97, 0.98 or, in particular, 0.99. The higher $\alpha$ is, the higher $I_C$ is and the more frequently the cleaning process should be performed. The value $\alpha$ should be chosen such that $I_C$ is substantially higher than the stable mean emission current $I_S$ of a particular cold field emitter. As shown in the article of W. K. Lo et al. referred to above, a typical mean stable emission current is about only 60% of the initial high emission current. Hence, when choosing $\alpha=0.9$, the emitter surface should be kept clean with a minimum emission of about 90% of the initial high emission $I_0$. A value of 0.95 should provide a minimum emission of 95%, and $\alpha=0.99$ should provide 99%. Therefore, the cold field emitter may be operated in the initial unstable region at which the contamination is unbalanced as described above. As the contamination may be continuously kept at minimum, adverse effects on the emitter surface should be substantially reduced leading to long-term stability and a long lifetime of the cold field emitter.

The cleaning process (24) may be started, for instance, after a pre-selected time interval or may be synchronized with inactive or non-operational periods of the SEM to transfer specimens to be investigated. A fixed time interval may be typically determined with respect to the quality of the vacuum applied, the type of cold field emitter used, and the value $I_C > I_S$ defining the minimum emission current. Alternatively or in combination with a fixed time interval, the emission current may be monitored to initiate the next cleaning process when the emission current has dropped to a pre-selected $I_C$ or when the emission current tends to become unstable.

Further, the cleaning process may be performed such that the emission current I is kept between $I_C$ as a minimum value $I_{min}$ and $I_{max}$ being lower than $I_0$. The emission current may thus oscillate or vary between $I_{min}=I_C$ and $I_{max}$.

Figure 5:
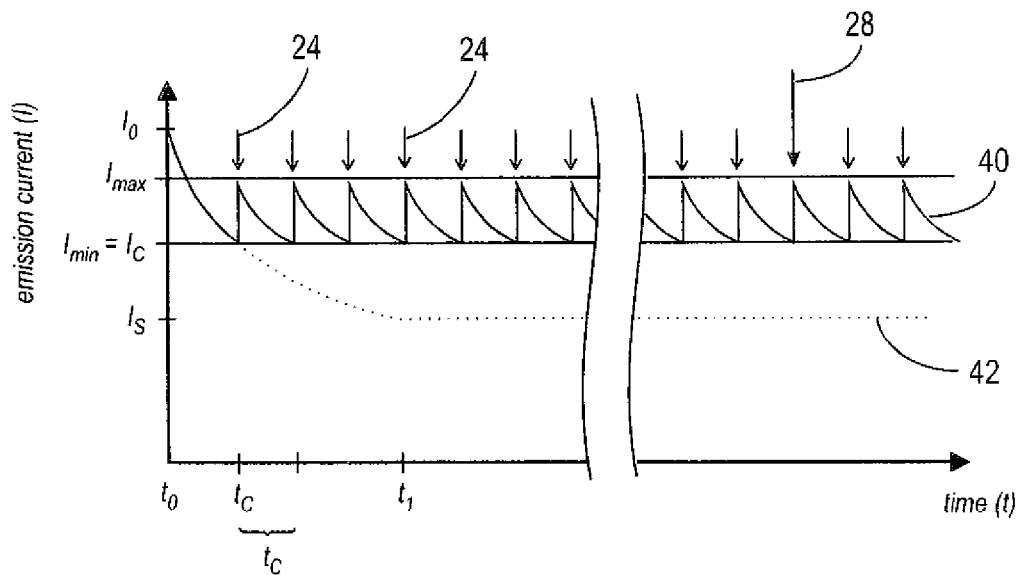
FIG. 5 shows the temporal course of the emission current upon controlling the cleaning by employing the emission current as control parameter in accordance with one embodiment of the invention.

With reference to FIG. 5 the temporal course of the emission current I is shown. A clean emitter tip may be assumed to be provided at time $t_0$. Under a given and constant electric extraction field generated by a given and constant voltage U applied between the emitter tip and the extraction electrode and under a given vacuum, an emission current I may be generated that has a high initial emission current $I_0$ at $t_0$. Upon further operation under constant conditions, the emission current I may decrease and assume a lower stable mean current $I_S$ at $t_1$. The decrease of the emission current may result from increasing contamination of the emitter surface over time. The typical emission characteristic of a cold field emitter under given constant conditions with no frequent cleaning is indicated in FIG. 5 by a dotted line 42.

In contrast thereto, the emission characteristic of a cold field emitter under The same condition but with frequent cleaning of the emitter surface is indicated by a bold line 40 in FIG. 5. As shown in FIG. 5, a first cleaning process 24 may be carried out when the emission current I has dropped to $I_{min}=I_C$. The cleaning processes are indicated by small arrows 24. $I_{min}$ may define the lower range of the desired emission current and may be a predefined value significantly higher than $I_s$. After cleaning, the emission current may rise to a value $I_{max}$. $I_{max}$ is shown in FIG. 5 as being lower than $I_0$, but can also equal $I_0$. The emission current I obtained after cleaning may depend on the intensity of the cleaning process, which may be governed by the temperature, duration, and number of the heating pulses applied. Upon further operation under constant condition (i.e., constant electric extraction field and given vacuum condition), the emission current may decline again. A further cleaning process 24 may be carried out when the emission current I has dropped again to $I_{min}$. The cleaning process may be repeated as often as required and, as indicated in FIG. 5, may be triggered when the emission current has dropped to $I_{min}$. Hence, the control parameter to control the cleaning process may be the emission current I which, in this case, should be monitored. By employing this approach, the emission current I may oscillate or vary between $I_{min}$ and $I_{max}$. Those skilled in the art will appreciate that the cleaning processes may also be performed without monitoring the emission current. In this case, the cleaning may be performed at fixed intervals that can be predefined depending on the type of cold field emitter used.

After a prolonged period of time, a build-up process 28 indicated by a big arrow in FIG. 5 may be performed to compensate slowly-progressing deformations of the emitter tip.

Figure 6:
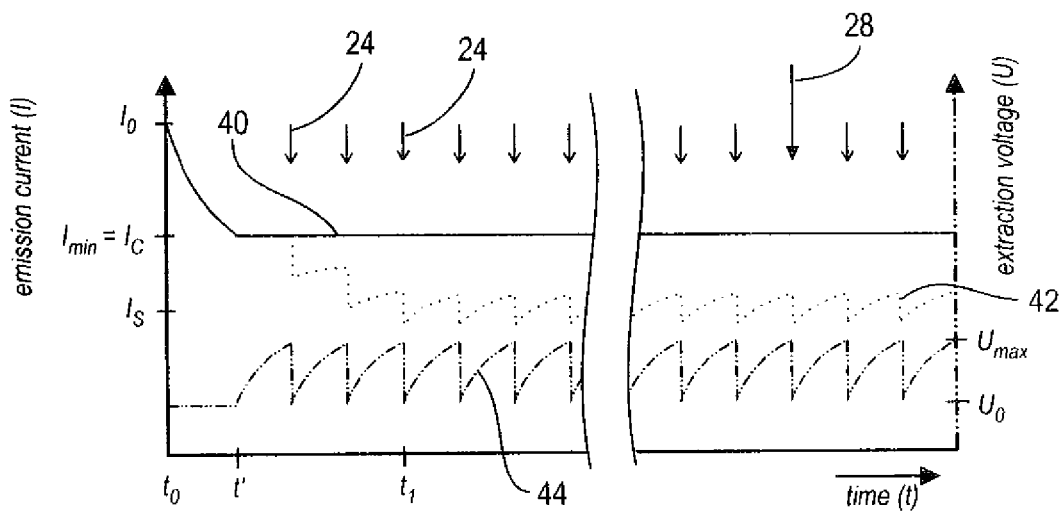
FIG. 6 shows the temporal course of the emission current upon controlling the cleaning by employing the voltage applied to generate the electric extraction field as control parameter in accordance with one embodiment of the invention.

Referring now to FIG. 6, the temporal course of the emission current I is exemplified for the case in which the voltage U applied to generate the electric extraction field may be adjusted between consecutive cleaning processes in an effort to keep the emission current stable. As in FIG. 5, dotted line 42 indicates the typical emission characteristic of a cold field emitter without frequent cleaning. The difference between the characteristics 42 shown in FIGS. 5 and 6 is that in FIG. 6 the voltage U applied may be adjusted in an effort to compensate the decline of the emission current 1. Without any cleaning the emission, I should decline to $I_S$ at about $t_1$ and may then vary about $I_S$ due to the variation of the voltage U, the temporal course of which is indicated by dashed and dotted line 44.

In contrast to the emission characteristic without frequent cleaning, the emission current I illustrated by bold line 40 should remain substantially stable due to frequent cleaning and the compensation between consecutive cleaning processes. In FIG. 6, the applied voltage $U_{min}$ may initially be kept constant over a period t'. During this period the emission current may decline from $I_0$ to $I_{min}$. At time t', the compensation of the decline may begin with an increase of the voltage U. The voltage U may be adjusted such that the emission current I remains substantially constant at $I_{min}$. To compensate the decline of emission current, the voltage U may need to be increased, and upon reaching a predefined value $U_{max}$, a cleaning process 24 may be performed to clean the emitter surface. After cleaning, the emitter surface may exhibit substantially the same emission characteristic as at time t' so that the applied voltage U may be reduced to the initial voltage $U_0$ to keep the emission constant. As the contamination of the emitter surface increases again, the voltage U may need to be adjusted as well and, more specifically, may need to be increased to compensate an otherwise observable decline of the emission current. The voltage U applied may therefore be considered as an indirect measure of the emission quality, and a cleaning process may be triggered when a predefined voltage value $U_{max}$ has been reached. Hence, the applied voltage U is in this embodiment the control parameter to control the cleaning process. For this control, the emission current should be monitored, as well.

It may also be desired to start with the compensation at time $t_0$ so that the emission current may be kept at $I_0$ or very close to it.

As in FIG. 5, build-up processes 28 may be performed upon request or when the emission quality is affected by slowly-progressing deformations or dulling of the emitter surface.

Figure 7:
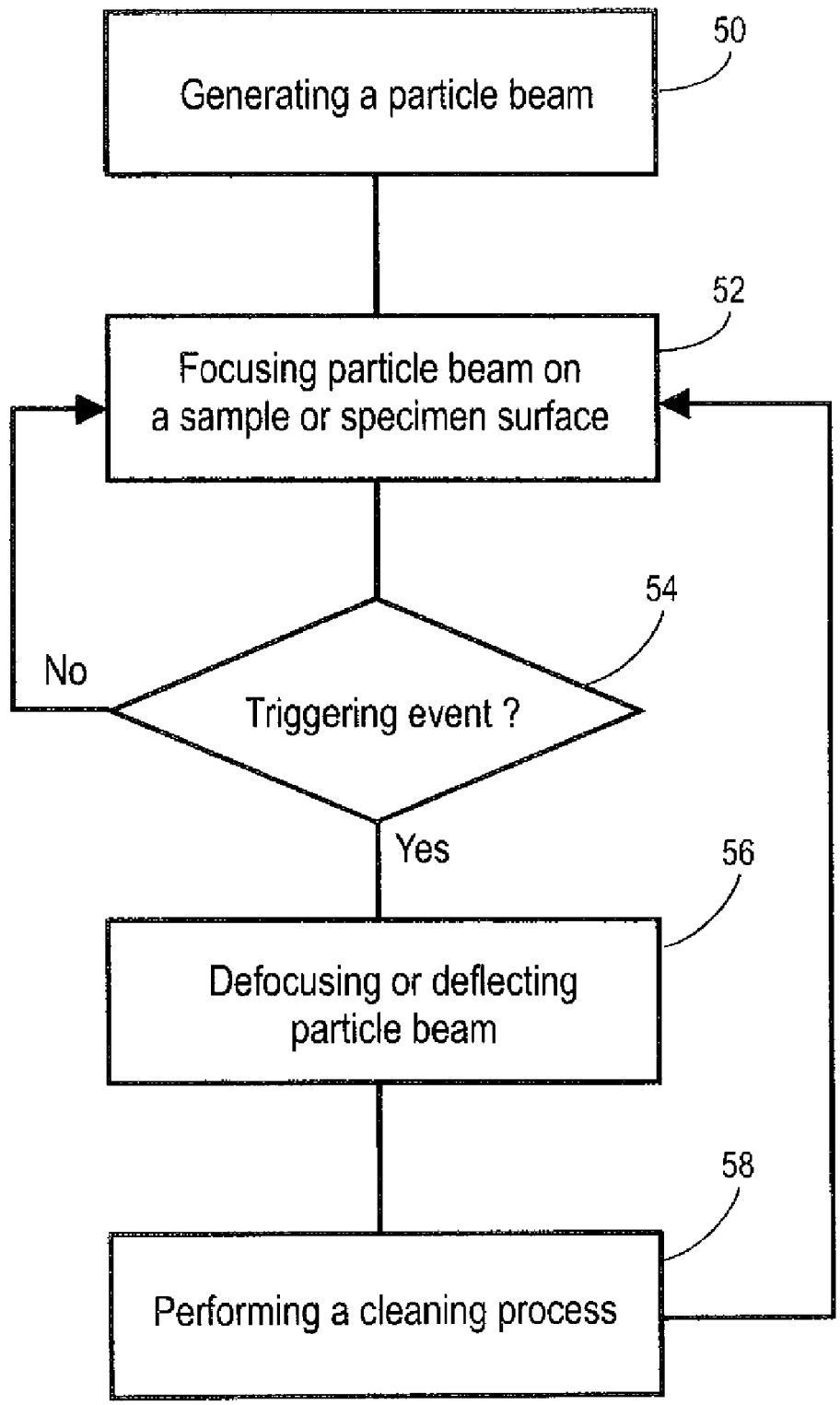
FIG. 7 shows main steps for synchronizing the cleaning process with triggering events in accordance with one embodiment of the invention.

Now referring to FIG. 7, the initiation of the cleaning process dependent on the occurrence of a triggering event is illustrated. During normal operation, a particle beam may be generated (50) and focused (52) onto the specimen or sample surface, for instance, to scan its surface. This period may be referred to as the active or operational period. Upon occurrence of a triggering event (54), the particle beam emitting device may be rendered inactive (i.e., the device's operation may temporarily be interrupted). Such triggering events may include a decline of the emission current or the rise of the extraction voltage to $U_{max}$ as described above. Other exemplary events may be a sample or specimen exchange which, for example, occurs in a high-throughput inspection or process diagnostic (CD & DR) of processed semiconductor wafers. The typical duration of such an exchange is about 10 sec. A further option may include a signal generated by a timer. The timer periods may be set based on experience or on preliminary tests made for determining the emission characteristic of a particular particle beam source. Time periods required to calibrate the particle beam emitting device and periods for moving the specimen or sample or the stage on which the specimen is arranged may also be utilized and form triggering events for a short period. Common to these exemplary events should be that they interrupt or prevent the intended purpose or function of the particle beam emitting device. For example, during these events no scan of the specimen surface may be carried out.

During the inactive or non-operational period initiated and defined by the triggering event, the particle beam may be deflected or defocused to avoid damaging of the specimen. Further, a cleaning process may be automatically initiated to clean the emitter surface of the particle or electron beam source. Typically, the generation of a particle or electron beam is not interrupted during the inactive periods and the cleaning process. This should allow a rapid return to the active period or a rapid switching between inactive and active periods. Further, it may enable an instant verification and control of the cleaning process. After completing the cleaning process, the particle beam emitting device may switch back to its active state.

It may also be desired that a decision whether or not a cleaning process is initiated depends on the occurrence of two or more events. For instance, a cleaning process may be performed during specimen or sample exchange only if the emission current has declined to $U_{min}$.

Figure 8:
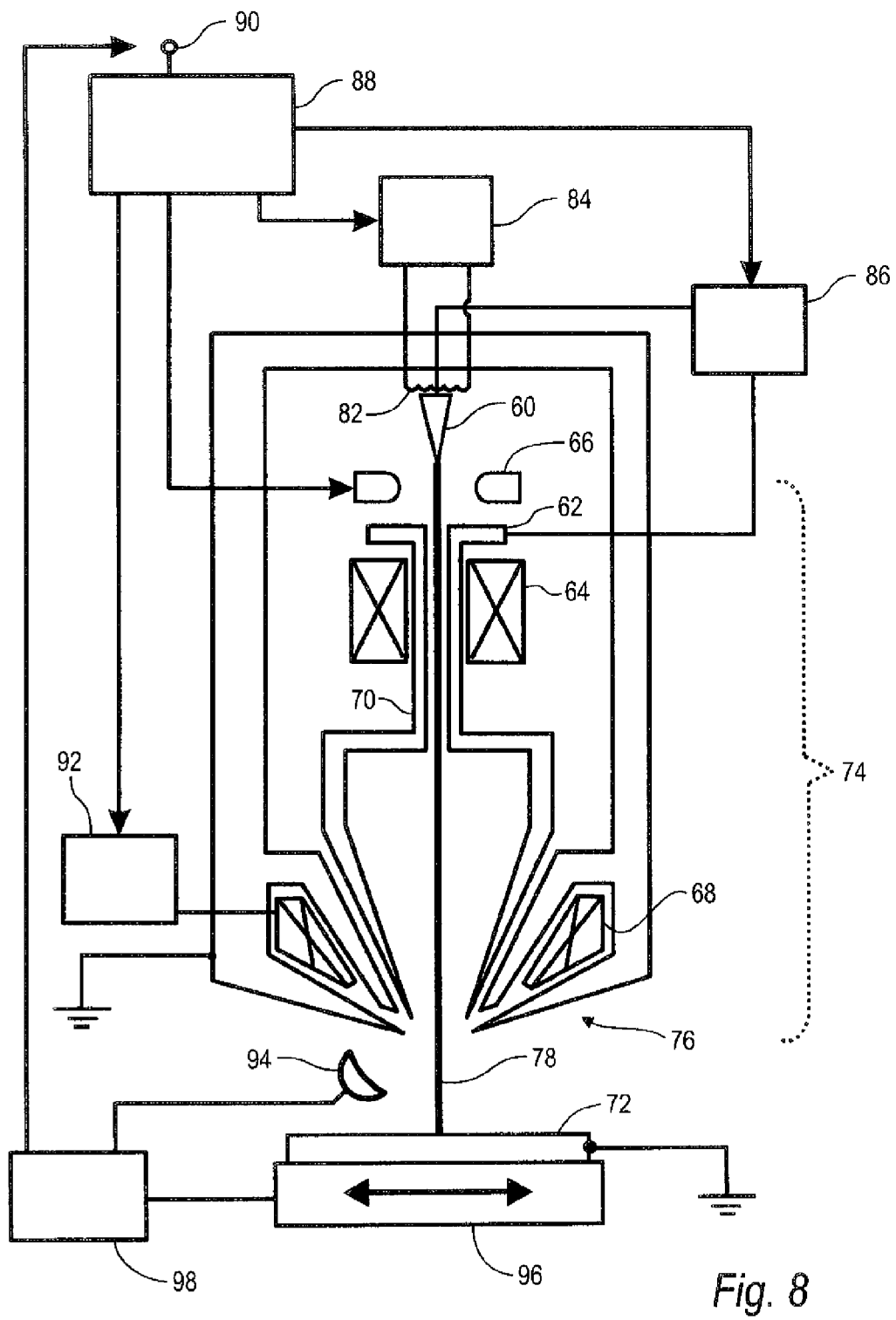
FIG. 8 shows an arrangement of a particle beam emitting device in accordance with one embodiment of the invention.

With reference to FIG. 8, a particle beam emitting device is described. The embodiment shown in FIG. 8 has a particle beam source 60 including an emitter surface, an extraction electrode, and a suppressor electrode (not shown). FIG. 8 is for illustrative purpose and is not drawn to scale.

The particle beam source 60 may generate a charged particle beam 78 which is an electron beam in this embodiment. The electron beam 78 may be accelerated by an anode 62 to energy of about 10 keV and guided through a high voltage beam column 70 towards a sample or specimen 72. The high voltage beam column 70 may serve to keep the electrons of the electron beam 78 at high energy before their deceleration. The high energy of the electrons during their passage through the beam optical system 74 may help to minimize diffusion and spreading of the electron beam 78.

In addition to the above mentioned components, the beam optical system 74 in FIG. 8 may comprise a condenser 64 and a final focus lens 76 to focus the electron beam 78 onto the specimen 72. The final focus lens 76 in this embodiment may focus the electron beam by means of a combination of a magnetic field generated by a final focus magnet coil 68 and an electric field generated by the voltage applied between specimen 72 and high voltage beam column 70. The high voltage beam column 70 may be electrically connected to anode 62 in order to provide an electric field free region for transporting the electron beam 78 towards the specimen 72. In the region between the final focus lens 76 and specimen 72, the electron beam 78 may become decelerated to a desired final energy at which the specimen is meant to be inspected. A beam blanker or deflector 66 may be arranged between particle beam source 60 and specimen 72 for deflecting the particle beam off the specimen surface. It is for clarity purposes of the drawings only that the beam optical system 74 illustrated in FIG. 8 shows only some of the components which are usually implemented in an SEM. For example, it does not show apertures, deflectors for scanning the specimen surface, or detectors for secondary electrons. However, a skilled person will appreciate that the illustrative SEM of FIG. 8 may include additional components depending on the application of the SEM.

By employing the beam blanker 66 a particle beam, such as an electron beam or ion beam, emitted from particle beam source 60 may be deflected during the cleaning process. Alternatively, the particle beam may become defocused by the final focus lens 76. Further, the particle beam may also be kept focused without deflecting it if, for instance, the emission current does not exceed an upper critical limit during cleaning or if no specimen is arranged in the particle beam emitting device. For cleaning the emitter surface the particle beam source 60 may include a heating element 82 for applying heating pulses to the emitter surface. Examples of heating elements are a resistive heater such as the tungsten wire of a cold field emitter and a laser beam directed onto the emitter surface. Instead of using the tungsten wire, a separate resistance heater can be used as well. Heating element 82 may be controlled by a heating control unit 84. The high voltage applied to particle beam source 60 and anode 62 may be controlled by voltage unit 86, and the final focus magnet coil 68 may be controlled by a focusing unit 92. A control unit 88 having an input 90 may be provided for controlling the heating control unit 84, voltage unit 86, beam blanker 66, and focusing unit 92.

Upon reception of a trigger signal by input 90, control unit 88 may initiate a cleaning process by prompting the heating control unit 84 to apply heating pulses to the emitter surface. At the same time, the particle beam 78 being continuously generated may be deflected by beam blanker 66 or defocused by the final focus lens 76. Control unit 88 may provide an overall control of the individual components.

The trigger signal may be provided by a triggering unit or synchronizing means 98, which may be operatively connected with a measuring element 94 for measuring the emission current and with a motion controller for controlling the movement of a carrying element 96. The motion controller is not shown in FIG. 8. The carrying element 96 may be, for instance, a stage for holding the specimen during inspection or imaging or may be a transfer unit for transferring the specimen into and out of the charged particle beam emitting device. Movements of the carrying elements, which may result in the generation of a trigger signal, may be stage movement to expose different portions of the specimen to the charged particle beam and a specimen exchange.

Returning back to FIG. 2, a build-up process (28) may be periodically or sporadically executed in addition to the frequent cleaning in an effort to sharpen the emitter tip and to reverse adverse effects resulting from frequently heating. As an example, although the temperature of the cleaning processes may be kept sufficiently low to prevent observable dulling or flattening of the emitter tip, over a long period including very many cleaning processes, the emitter tip gradually tends to become dull, which may mean that the radius of the emitter tip's curvature has decreased. Since the electric field strength at the emitter tip is inversely proportional to the radius of the tip curvature, the dulling may result in a decrease of the electric filed strength at the emitter surface and thus to an observable reduction of emission current. A build-up may typically be carried out when the emission current tends to become unstable or has an intolerable beam quality.

The build-up process (28) may be carried out by applying heating pulses to the emitter tip under the presence of a strong electrostatic field. A strong electrostatic field may cause a transfer of the emitter tip's material towards its apex so that the emitter tip becomes more elongated and sharper. Those skilled in the art will appreciate that the electrostatic force generated by the applied electric field needs to be higher than the force generated by the surface tension of the heated emitter tip. The temperature upon which the emitter tip is heated may be about 2000 K to 3000 K. The polarity of the applied electric field is of no importance, hence, a polarity of the electric field opposite to the polarity of an electric extraction field may be used which may ensure that no field emission occurs and that thermal emission may be substantially suppressed. For applying the constant electrostatic field, a suitable voltage may be applied to the extractor electrode. The voltage applied during build-up may typically be higher than the extractor voltage. The required field strength $F_0$ for a build-up process follows from equation (1)

$$F_0 > \frac{8.1 \times 10^4}{\sqrt{r}} \text{ (V/cm)} \tag{1}$$

where r is the tip radius in cm. For an emitter tip radius of 50 nm, the corresponding field strength should be higher than $3.6 \times 10^7$ V/cm.

The form of the heating pulses applied during the build-up processes (28) (i.e., the pulse width and amplitude) may play an important role in the efficiency of the build-up process. As an example, a single heating pulse may have a width of about 1 to 2 sec. Typically, 5 to 10 heating pulses may be required to sharpen the emitter tip.

It is worth noting that build-up processes and cleaning processes are different processes. The main difference between cleaning and build-up for a given emitter tip is that the temperature at which the emitter tip is heated may be lower during a cleaning process than during a build-up process so that the emitter tip's material is not mobile enough to experience observable re-shaping during a cleaning process.

During a build-up process, the emission current of the emitter tip or the emission surface, respectively, may be measured to monitor the build-up process. The build-up process may be terminated when the desired strength of the emission current is detected.

Unlike prior art build-up processes, the build-up process (28) described above may not require extra gas to adjust the partial pressure of a particular gas component (e.g., $O_2$). Further, multiple heating pulses may be used instead of a constant heating.

Build-up processes (30) may be regularly repeated (32), but less frequently than the cleaning process. Typically, a build-up process may be initiated upon detection of unstable or decreased emission current.

To obtain the best results, a suitable combination of master cleaning, frequent cleaning, and build-up process may be desired to obtain a high stability of emission current (for instance about 1%), a high brightness of the cold field emitter, and practically unlimited life time of the cold field emitter.

Having thus described the invention in detail, it should be apparent for a person skilled in the art that various modifications can be made in the present invention without departing from the spirit and scope of the following claims.

The invention claimed is:

1. A method for operating a charged particle beam emitting device comprising a charged particle beam source having an emitter surface, the method comprising the steps of:
    (a) placing the charged particle beam source in a vacuum of a given pressure, the charged particle beam source exhibiting a high initial emission current $I_0$ and a lower stable mean emission current $I_S$ under given operational conditions;
    (b) applying the given operational conditions to the charged particle beam source for emitting charged particles from the emitter surface, so that the emission current of the charged particle beam source is higher than the stable mean emission current $I_S$;
    (c) performing a cleaning process by applying at least one heating pulse to the charged particle beam source for heating the emitter surface to a temperature $T_C$, whereby the cleaning process is performed before the emission current of the charged particle beam source has declined to the lower stable mean emission value $I_S$; and
    (d) repeating the cleaning process to keep the emission current of the charged particle beam source continuously above the substantially stable emission value $I_S$.

2. The method as claimed in claim 1, wherein the cleaning process is performed at predefined time intervals or when the emission current has dropped to a predefined value $I_C$, wherein $I_C$ is higher than the stable mean emission value $I_S$.

3. The method as claimed in claim 2, wherein $I_C$ is defined as $I_C=\alpha I_0$ with $\alpha>0.9$.

4. The method as claimed in claim 2, wherein a predefined maximum value $I_{max}$, and a predefined minimum value $I_{min}=I_C>I_S$ is selected, whereby a mean deviation value $\Delta I$ is defined as $\Delta I=I_{max}-I_{min}$, and the cleaning process is performed when the emission current has fallen from the maximum emission value $I_{max}$ to $I_{min}$.

5. The method as claimed in claim 4, wherein $\Delta I/I_{max}=\gamma$, and $\gamma$ is about 0.1.

6. The method as claimed in claim 1, wherein
    the charged particle beam emitting device is an electron beam emitting device,
    the charged particle beam source is an electron emitter for emitting electrons and
    the given operational conditions comprise a given pressure and a given energy applied to the emitter surface of the electron emitter to extract electrons.

7. The method as claimed in claim 6, wherein the electron emitter is a cold field emitter and the energy is an electric field.

8. The method as claimed in claim 1, wherein:
    the charged particle beam emitting device is an ion beam emitting device; and
    the charged particle beam source is an ion emitter for emitting ions.

9. The method as claimed in claim 1, wherein step (a) comprises a master cleaning process for cleaning the emitter surface such that the charged particle beam source exhibits the high initial emission current $I_0$ and the lower stable mean emission current $I_S$.

10. The method as claimed in claim 9, wherein the master cleaning process comprises at least one master heating pulse to heat the emitter surface to a temperature $T_{MC}$.

11. The method as claimed in claim 10, wherein $T_{MC}$ is about 2500 K to 2800 K.

12. The method as claimed in claim 1, wherein the charged particle beam source has an emitter tip at which the emitter surface is formed and wherein a thermal build-up process is performed to sharpen the emitter tip.

13. The method as claimed in claim 12, wherein multiple heating pulses are applied to the charged particle beam source during the build-up process.

14. The method as claimed in claim 13, wherein the heating pulses heat the emitter surface to a temperature $T_B$, which is higher than the temperature $T_C$ of the cleaning process.

15. The method as claimed in claim 1, wherein the cleaning process is automatically synchronized with non-operational periods of the charged particle beam emitting device.

16. The method as claimed in claim 15, wherein the non-operational periods are periods during which the charged particle beam is defocused or deflected from a sample or specimen.

17. The method as claimed in claim 15, wherein the non-operational periods are triggered by an impulse of a timer, a drop of the emission current, an exchange of a sample or specimen, calibration of the charged particle beam emitting device, a sample or specimen movement, or a stage movement.

18. A method for operating an electron beam emitting device comprising a cold field emitter having an emitter surface, the method comprising the steps of:
    (a) placing the cold field emitter in a vacuum of a given pressure, the cold field emitter exhibiting a high initial emission current $I_0$ and a lower stable mean emission current $I_S$ under a given electric extraction field;
    (b) applying the given electric extraction field to the cold field emitter for emitting electrons from the emitter surface, so that the emission current of the cold field emitter is higher than the stable mean emission current $I_S$;
    (c) adjusting the strength of the electric extraction field to keep the emission current substantially stable and continuously above the mean stable emission current $I_S$ at a predefined value $I_C$ being higher than $I_S$;
    (d) performing a cleaning process by applying at least one heating pulse to the cold field emitter for heating the emitter surface to a temperature $T_C$, whereby the cleaning process is performed when the strength of the electric extraction field exceeds a predefined reference value; and
    (e) repeating the adjusting step (c) and the cleaning process to keep the emission current of the cold field emitter continuously above the substantially stable emission value $I_S$.

19. The method as claimed in claim 18, wherein the predefined value $I_C$ is defined as $I_C=\alpha I_0$, wherein $\alpha>0.9$.

20. The method as claimed in claim 18, wherein $T_C$ is about 2200 K to 2500 K.

21. The method as claimed in claim 18, wherein the pulse width of the at least one heating pulse is 1 second to 2 seconds.

22. The method as claimed in claim 18, wherein each cleaning process comprises about 10 heating pulses and, in particular, 2 to 4 heating pulses being applied to the particle beam source or cold field emitter about every 1 second to 3 seconds.

23. The method as claimed in claim 18, wherein the electron beam emitting device comprises a suppressor electrode arranged around the cold field emitter, and wherein a suppressor voltage is applied to the suppressor electrode during the cleaning process.

24. The method as claimed in claim 23, wherein the suppressor voltage is between 300 V and 1000 V.

25. A method for operating a charged particle beam emitting device comprising a charged particle beam source having an emitter surface, the method comprising the steps of:
(a) generating a charged particle beam;
(b) focusing the generated charged particle beam onto a sample or specimen; and
(c) automatically performing a cleaning process for cleaning the emitter surface upon occurrence of a triggering event, wherein the triggering event is an impulse of a timer, a decline of an emission current of the charged particle beam emitting device, an exchange of the sample or specimen, a calibration period, a sample or specimen movement, or a stage movement.

26. The method as claimed in claim 25, wherein the charged particle beam is defocused or deflected from the sample or specimen during the cleaning process.

27. A charged particle beam emitting device comprising:
a charged particle beam source for emitting charged particles, the charged particle beam source comprising an emitter surface;
a voltage unit configured to apply a voltage to the charged particle beam source for generating a charged particle beam;
a heating element configured to heat the emitter surface; and
a control unit comprising an input configured to receive a trigger signal, the control unit being operative to control the heating element to apply at least one heating pulse to the emitter surface of the charged particle beam source during the generation of the charged particle beam upon reception of a trigger signal, generated in response to a triggering event wherein the triggering event is an impulse of a timer, a decline of an emission current of the charged particle beam emitting device, an exchange of the sample or specimen, a calibration period, a sample or specimen movement, or a stage movement.

28. The charged particle beam emitting device as claimed in claim 27, wherein the charged particle beam emitting device comprises a beam blanker, the control unit being operative to control the beam blanker to deflect the generated particle beam upon reception of the trigger signal.

29. The charged particle beam emitting device as claimed in claim 27, wherein the charged particle beam emitting device comprises a focusing unit configured to focus and defocus the charged particle beam onto a sample or specimen, the control unit being operative to control the focusing unit to defocus the generated charged particle beam with respect to the sample or specimen upon reception of the trigger signal.

30. The charged particle beam emitting device as claimed in claim 27, wherein the charged particle beam emitting device is an electron beam emitting device and the charged particle beam source is a cold field electron emitter.

31. The charged particle beam emitting device as claimed in claim 30, wherein the electron beam emitting device is a scanning electron microscope (SEM), a transmission electron microscope (TEM), or a scanning transmission electron microscope (STEM).

32. The charged particle beam emitting device as claimed in claim 27, wherein the charged particle beam emitting device is an ion beam emitting device and the charged particle beam source is an ion emitter.

33. The charged particle beam emitting device as claimed in claim 27, wherein the emitter surface of the charged particle beam source has a radius of curvature of less than 250 nm.

34. The charged particle beam emitting device as claimed in claim 27, wherein the charged particle beam emitting device comprises a measuring element configured to measure the emission current of the charged particle beam source and a triggering unit adapted to provide a trigger signal when the emission current has dropped to a predefined value.

35. The charged particle beam emitting device as claimed in claim 27, wherein the charged particle beam emitting device comprises a carrying element configured to movably carry a specimen, a motion controller unit configured to control the carrying element, and a synchronizing means adapted to provide a trigger signal upon movement of the carrying element.

36. A charged particle beam emitting device comprising:
a charged particle beam source for emitting charged particles, the charged particle beam source comprising an emitter surface;
a voltage unit for applying a voltage to the charged particle beam source for generating a charged particle beam;
a heating element configured to heat the emitter surface; and
a control unit comprising an input for receiving a trigger signal, the control unit being operative to control the heating element to apply at least one heating pulse to the emitter surface of the charged particle beam source during the generation of the charged particle beam upon reception of a trigger signal;
characterized in that the charged particle beam emitting device further comprises a measuring element for measuring the emission current of the charged particle beam source, and a triggering unit adapted to provide the trigger signal when the voltage applied by the voltage unit exceeds a predefined voltage value.

* * * * *